United States Patent
Holleczek et al.

(10) Patent No.: US 12,010,822 B2
(45) Date of Patent: Jun. 11, 2024

(54) COOLING DEVICE

(71) Applicant: Robert Bosch GmbH, Stuttgart (DE)

(72) Inventors: Annemarie Holleczek, Stuttgart (DE); Joao Santos, Barcouco (PT); Joao Oliveira, Fao (PT); Joao Costa, Trofa (PT)

(73) Assignee: ROBERT BOSCH GMBH, Stuttgart (DE)

(*) Notice: Subject to any disclaimer, the term of this patent is extended or adjusted under 35 U.S.C. 154(b) by 971 days.

(21) Appl. No.: 16/964,068

(22) PCT Filed: Feb. 4, 2019

(86) PCT No.: PCT/EP2019/052579
§ 371 (c)(1),
(2) Date: Jul. 22, 2020

(87) PCT Pub. No.: WO2019/166180
PCT Pub. Date: Sep. 6, 2019

(65) Prior Publication Data
US 2021/0051821 A1    Feb. 18, 2021

(30) Foreign Application Priority Data
Mar. 1, 2018    (DE) .......................... 102018203075.8

(51) Int. Cl.
*H05K 7/20*    (2006.01)
*B60K 11/04*    (2006.01)
(Continued)

(52) U.S. Cl.
CPC .......... *H05K 7/20863* (2013.01); *B60K 11/04* (2013.01); *G01S 17/86* (2020.01);
(Continued)

(58) Field of Classification Search
CPC ...... H05K 7/20863; H02K 9/06; G01S 17/86; B60K 11/04; F28D 2021/0028; F28D 2021/008
See application file for complete search history.

(56) References Cited

U.S. PATENT DOCUMENTS 4,884,631 A    12/1989    Rippel
5,576,932 A    11/1996    Bishop et al.
(Continued)

FOREIGN PATENT DOCUMENTS

CN    201853143 U    6/2011
CN    102741083 A    10/2012
(Continued)

OTHER PUBLICATIONS

International Search Report for PCT/EP2019/052579, Issued Apr. 23, 2019.

*Primary Examiner* — Henry T Crenshaw
(74) *Attorney, Agent, or Firm* — NORTON ROSE FULBRIGHT US LLP; Gerard A. Messina (57) ABSTRACT

A cooling device including a housing frame, a heat exchanger, an electrically drivable fan unit, a control unit, and a sensor unit. The housing frame can be disposed on a first surface of the heat exchanger. The fan unit is configured so that, during operation of the fan unit, a first air flow is produced toward the first surface of the heat exchanger. The fan unit is accommodated in a recess of the housing frame. The housing frame has at least one air channel having an air inlet opening and an air outlet opening, the air channel being formed parallel to the first surface of the heat exchanger, allowing a second air flow to pass through the air channel along the first surface. A measured quantity is recorded by the sensor unit, and the fan unit is driven by the control unit as a function of the recorded measured quantity.

16 Claims, 5 Drawing Sheets

(51) Int. Cl.
  *F28D 21/00* (2006.01)
  *G01S 17/86* (2020.01)
  *H02K 9/06* (2006.01)
(52) U.S. Cl.
  CPC ....... *H02K 9/06* (2013.01); *F28D 2021/0028* (2013.01); *F28D 2021/008* (2013.01)

(56) References Cited

U.S. PATENT DOCUMENTS

| | | | |
|---|---|---|---|
| 6,305,463 B1 | 10/2001 | Salmonson | |
| 7,290,630 B2 * | 11/2007 | Maeda | F28F 1/128 180/69.2 |
| 7,652,880 B2 | 1/2010 | Wayman | |
| 9,734,744 B1 * | 8/2017 | McGie | G09G 3/14 |
| 2010/0157531 A1 * | 6/2010 | Mason | H01Q 3/26 361/697 |
| 2011/0308776 A1 | 12/2011 | Huang et al. | |
| 2014/0014313 A1 | 1/2014 | Hong et al. | |
| 2016/0061899 A1 * | 3/2016 | Gauthier | G01R 31/343 701/34.4 |
| 2017/0074652 A1 * | 3/2017 | Send | G06F 3/0423 |
| 2017/0200273 A1 * | 7/2017 | Kamilov | G01S 17/86 |
| 2017/0210206 A1 * | 7/2017 | Dienhart | B60H 1/00328 |
| 2017/0261273 A1 * | 9/2017 | Maranville | G01S 17/931 |

FOREIGN PATENT DOCUMENTS

| | | |
|---|---|---|
| CN | 206074802 U | 4/2017 |
| CN | 206161843 U | 5/2017 |
| DE | 102004035741 A1 | 3/2005 |
| DE | 102017104988 A1 | 9/2017 |

* cited by examiner

COOLING DEVICE

FIELD

The present invention relates to a cooling device which is designed, in particular for cooling a driving environment sensor of a motor vehicle. The present invention also relates to a method for cooling a heat-radiating apparatus, in particular a driving environment sensor of a motor vehicle, as well as to a vehicle and a lidar sensor having a cooling device.

BACKGROUND INFORMATION

U.S. Pat. No. 4,884,631 describes a cooling device where an air flow is directed along a plurality of paths through a cooling structure. The cooling structure has cooling fins or cooling honeycombs.

U.S. Pat. No. 6,305,463 B1 discusses a cooling device for circuit modules. The cooling device has a liquid cooled section and an air cooled section. The sections can be used mutually independently and are configured to allow the cooling device to be used for different applications depending on the cooling power required for a particular application. It is also possible to use both the air-cooled section as well as the liquid-cooled section.

U.S. Pat. No. 7,652,880 B2 describes a cooling device where both natural convection as well as an air flow generated by a fan are used for cooling. For that purpose, the cooling device has a heat sink, which includes cooling fins and a plurality of air channels, as well as at least one fan.

Cooling devices, which have cooling fins, are usually designed to use either natural convection, forced air flows, or combinations of both for cooling.

Scenarios are possible, however, especially for use in a motor vehicle, where the external air flow generated by the movement of the vehicle is additionally needed for adequate cooling. An example is a sensor unit, for example, a driving environment sensor of the vehicle, which itself produces heat due to the electronics thereof and must be cooled, and which is secured near the engine compartment of the vehicle. In this area, temperatures of up to 140° C. can occur in the case of an internal combustion engine. The cooling by the external air flow (head wind) is no longer sufficient when high external temperatures are additionally present due to solar radiation, and the vehicle is at a standstill with the engine running or is advancing only slowly, for example, when in a traffic jam. It is necessary that the sensor unit stop operation to avoid damage caused by overheating of the electronics or the sensor components.

A related-art cooling device can eliminate the problem by using electrically driven fans to dissipate heat by convection even when there is no external air flow. The disadvantage of these systems is that the fans run in continuous operation and consume energy, even in situations where the head wind is sufficient to ensure adequate cooling of the sensor unit.

SUMMARY

The present invention provides a cooling device which includes a housing frame, a heat exchanger, an electrically drivable fan unit, a control unit and a sensor unit. Moreover, the cooling device may include other functional units, such as pressure compensation elements, connections, etc. The housing frame may thereby be disposed on a first surface of the heat exchanger, in particular. The fan unit, for example, a fan or ventilator, is configured in such a way that, during operation of the fan unit, a first air flow is generated toward the first surface of the heat exchanger. The fan unit is accommodated in a recess of the housing frame, for example. In accordance with the present invention, the housing frame has at least one air channel having an air inlet opening and an air outlet opening, the air channel being formed parallel to the first surface of the heat exchanger, so that a second air flow may pass through the air channel along the first surface. At least one measured quantity may be recorded by the sensor unit, and the fan unit may be driven by the control unit as a function of this at least one recorded measured quantity.

Thus, the present invention makes it possible to provide a cooling device that may be automatically switched between an active and a passive cooling operation, for example, as a function of the current temperature of the surface to be cooled. Thus, for example, the fan unit may be switched off when the second, external air flow is sufficient to produce the required cooling power. Thus, external conditions, such as head wind, for example, may be advantageously used to achieve efficient cooling without the need for constantly operating the fan unit.

When using the present inventive cooling device in the automobile, the benefit is thereby derived that a more flexible mounting location on a vehicle is possible for the devices to be cooled. Even possible, for example, is a placement in the engine compartment area. The cooling device according to the present invention may be advantageously used, in particular to cool driving environment sensors of the vehicle, such as lidar sensors, which produce a substantial amount of waste heat of up to 120 W, for example, and makes possible an improved and more flexible usability of such sensors on the vehicle. The cooling device according to the present invention is compact, modular and integrates all required components.

The housing frame is preferably placed on the heat exchanger, resulting in a compact and stable mounting of the cooling device.

In a preferred embodiment, the first surface of the heat exchanger has a plurality of cooling fins, which, in particular are oriented along the air channel. This further improves the cooling power.

The sensor unit preferably has at least one temperature sensor. The sensor unit records a temperature of the heat exchanger as a measured quantity, and the fan unit is driven as a function of the recorded temperature.

In one possible embodiment of the present invention, the housing frame has a material having a thermal conductivity of less than 15 W/mK. This prevents the housing frame from heating up and the fan unit and/or the control unit from being damaged by heat. In addition, materials of this kind, for example, plastics, are often more lightweight than materials having a higher thermal conductivity.

To dissipate heat effectively, the heat exchanger preferably has a material having a thermal conductivity of more than 50 W/mK.

The modular design that includes a separate heat exchanger and housing frame makes it advantageously possible for different materials to be used for constructing the cooling device, resulting in a design that is altogether more lightweight and cost-effective in comparison to the related art.

In a second aspect of the present invention, a method is provided for cooling a heat-radiating apparatus, in particular a driving environment sensor of a motor vehicle, where a cooling device as described above is used. At least one measured quantity, in particular a temperature and/or a flow velocity, is recorded by the sensor device, and the fan unit is driven as a function of the at least one recorded measured quantity. Thus, the fan unit generates a first air flow which is oriented toward the first surface of the heat exchanger. In the case of a movement of the cooling device in a predefined direction, the movement generates a second air flow through the air channel.

Another aspect of the present invention provides a motor vehicle. The vehicle has a heat-radiating apparatus, in particular a driving environment sensor, mounted on the vehicle, as well as a cooling device designed in accordance with the present invention. A second surface of the heat exchanger of the cooling device opposite the first surface of the heat exchanger of the cooling device is disposed in heat-conductive contact with the heat-radiating apparatus. The cooling device is oriented in such a way that a forward movement of the vehicle generates an external, second air flow through the at least one air channel of the cooling device. In particular, the heat exchanger may be integrally formed, for example, with a housing of the heat-radiating apparatus.

The cooling device, respectively the heat-radiating apparatus, which is in heat-conductive contact with the heat exchanger of the cooling device, may, in principle, be mounted at any desired location on the vehicle. It is merely necessary that the air channel(s) be oriented toward the head wind during forward movement of the vehicle. The heat-radiating apparatus and/or the cooling device may be mounted on the roof of the vehicle, for example. The heat-radiating apparatus and/or the cooling device may be mounted, for example, in the area of the bumper at the front of the vehicle. The heat-radiating apparatus and/or the cooling device may thereby be mounted, for example, at least partially in the engine compartment and/or in the immediate vicinity of the engine compartment of the vehicle.

The cooling device may be modularly placed on the housing of the heat-radiating apparatus, for example, when the heat-radiating apparatus is installed in or on the vehicle. Alternatively, the cooling device may be integrally installed with the heat-radiating apparatus.

The heat-radiating apparatus is in the form of a lidar sensor, for example. Lidar sensors are preferably used for sensing the driving environment, in particular for autonomous driving functions and driver assistance functions. Lidar sensors are usually implemented with one or a plurality of laser diodes, which, in conjunction with the driver circuits thereof, typically generate a substantial amount of waste heat and must be cooled.

Moreover, the present invention provides a driving environment sensor, in particular a lidar sensor having a cooling device as described above.

In a preferred embodiment of the present invention, the lidar sensor has at least two inventive cooling devices.

In a preferred embodiment of the present invention, the heat exchanger is integrated in the lidar sensor, in particular in a housing thereof, and the housing frame is placed on the heat exchanger. This is especially beneficial since the direct connection and the resultant low thermal resistance make it possible to provide a very efficient design for cooling the lidar sensor.

In an alternative embodiment of the present invention, the heat exchanger may be separately configured and placed, for example, on a heat-radiating outer surface of the lidar sensor.

A lidar sensor typically has a housing within which the sensor electronics and optics are accommodated. The housing may include a measurement window through which the light may pass into the ambient environment and/or reflected light may be received therefrom. In accordance with the present invention, the housing may have one or a plurality of cooling devices featuring an inventive design.

In an alternative embodiment of the present invention, the design of the lidar sensor may be such that a camera unit, which represents the receiver of the lidar sensor, and one or a plurality of illuminators, which are adapted for emitting light into the ambient environment of the lidar sensor, are provided separately, in particular have separate housings. For cooling purposes, the camera unit and/or the illuminator(s) may each have one or a plurality of cooling devices designed in accordance with the present invention.

In all the aspects thereof, the present invention permits an intelligent cooling approach which makes it possible to automatically switch between an active and a passive cooling mode and for the active cooling mode to be regulated in a way that always achieves optimum cooling power. Thus, in particular, when there is a sufficient external air flow, the active cooling mode may be deactivated.

BRIEF DESCRIPTION OF THE DRAWINGS

FIG. 3a)-c) each show a sectional view through the cooling device according to FIG. 1, different operating states of the cooling device being shown.

DETAILED DESCRIPTION OF EXAMPLE EMBODIMENTS

In the following description of exemplary embodiments of the present invention, the same reference numerals denote identical elements, in some instances, there being no need to repeat the description of these elements. The figures represent the subject matter of the present invention only schematically.

Figure 1:
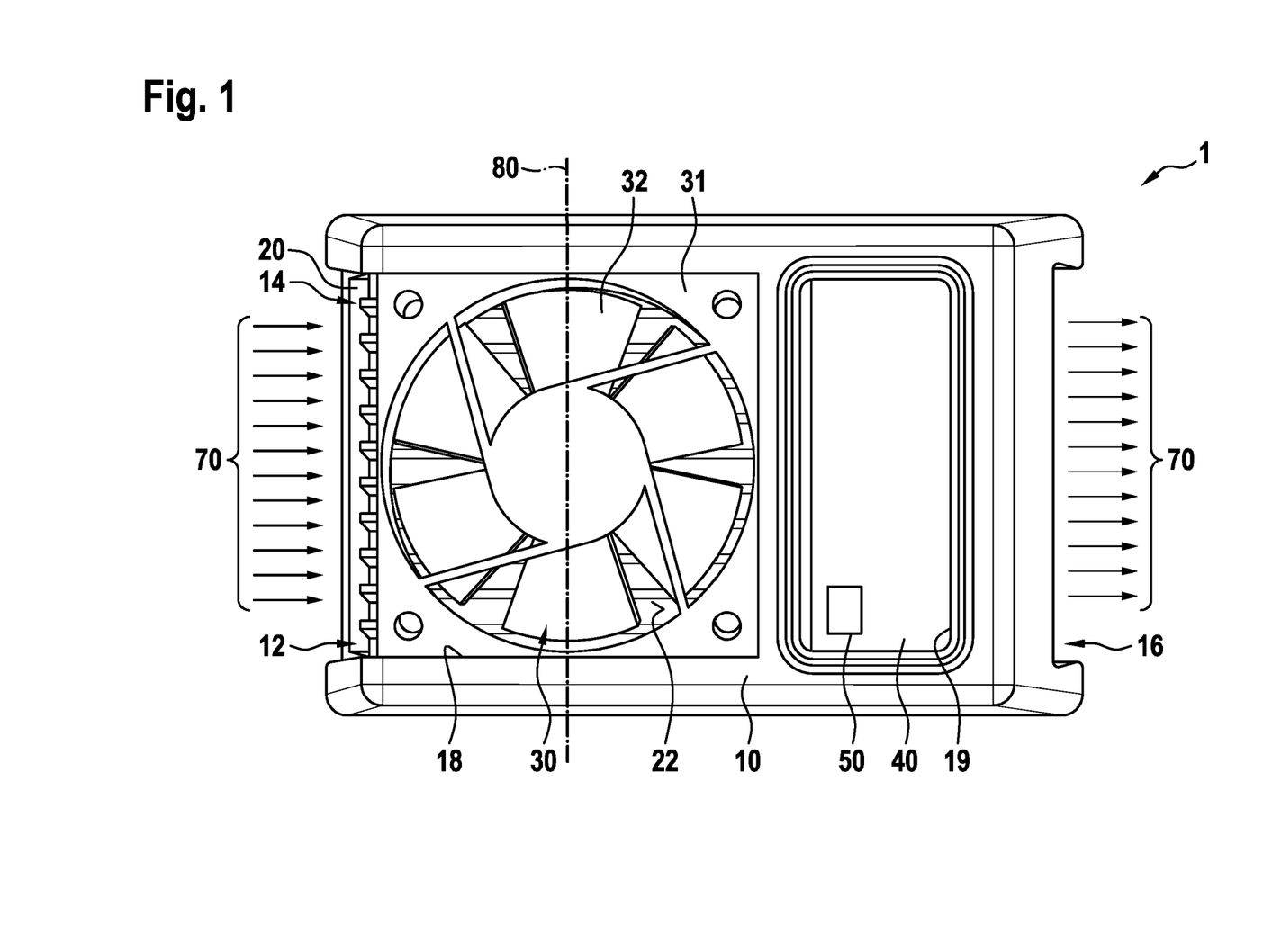
FIG. 1 shows a plan view of a possible variant of an example cooling device according to the present invention.

FIG. 1 shows a plan view of a possible exemplary embodiment of a cooling device 1 according to the present invention. A structurally identical cooling device 1 is shown in an oblique view in FIG. 2.

Figure 2:
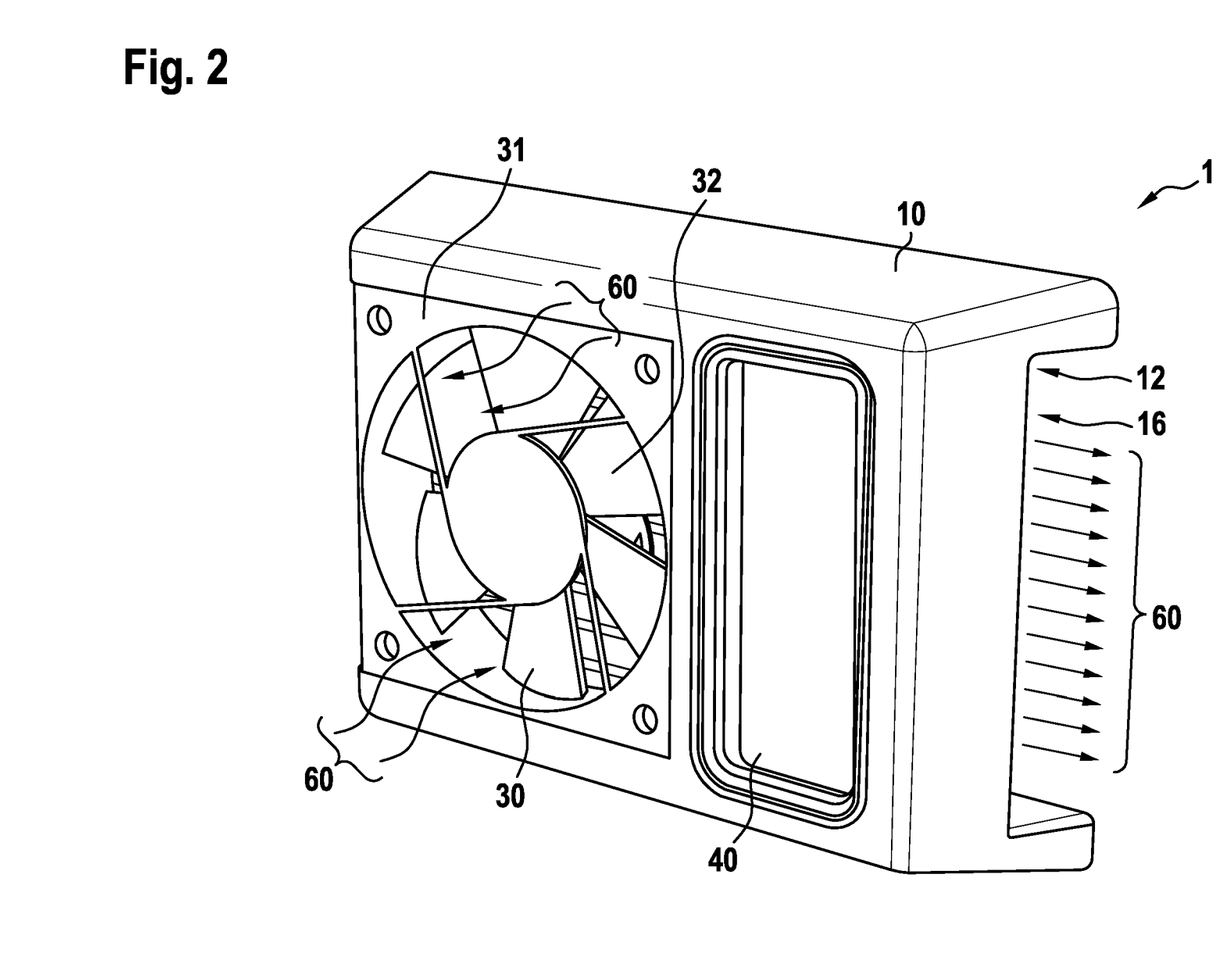
FIG. 2 shows the cooling device according to FIG. 1 in an oblique view.

Cooling device 1 includes a housing frame 10, which is placed on a heat exchanger 20 and partially projects laterally beyond the same. In this example, heat exchanger 20 is in the form of a cooling plate and has a first surface 22 that faces housing frame 10. An electrically drivable fan unit 30 and a control unit 40 are accommodated in housing frame 10, each in recesses 18, 19 of housing frame 10. Fan unit 30 is configured in such a way that when, in operation, a first air flow 60 is produced toward first surface 22 of heat exchanger 20. In this example, first surface 22 of heat exchanger 20 is covered by housing frame 10 and has a plurality of cooling fins. On one side, housing frame 10 has an air inlet opening 14 and, on an opposite side, an air outlet opening 16. Thus, an air channel 12 is formed which extends parallel to first surface 22 of heat exchanger 20. A second air flow 70 may pass through the air channel along first surface 22. Second air flow 70 is also referred to as external air flow since it is not generated by fan unit 30, rather, for example, by a movement in a direction which corresponds to the direction of air channel 12. Furthermore, cooling device 1 includes a sensor unit 50, which records at least one measured quantity, for example, the temperature of heat exchanger 20. Sensor unit 50 may be integrated in control unit 40, for example, or located separately on heat exchanger 20. Control unit 40 is adapted for driving fan unit 30. In accordance with the present invention, fan unit 30 is driven by control unit 40 as a function of the at least one measured quantity recorded by sensor unit 50. Thus, fan unit 30 may only be put into operation, for example, when the temperature of heat exchanger 20 exceeds a specific limiting value. A rotational speed of the fan unit may also be regulated as a function of the measured quantity, for example. A thermoelement or other conventional temperature measurement sensors may be used as a sensor unit 50, for example.

Housing frame 10 preferably includes a material having a comparatively low thermal conductivity, in particular of less than 15 W/Km in order to avoid damage caused by overheating of fan unit 30 and/or of control unit 40 and to save weight. Such a material may be a plastic, such as polypropylene, for example.

Heat exchanger 20 preferably includes a material having a comparatively high thermal conductivity, in particular of more than 50 W/Km to efficiently dissipate heat from a surface to be cooled. Such a material may be a metal, for example, such as aluminum or copper, or a special ceramic or an alloy. Cooling device 1 is preferably installed in such a way that a second surface 23 of heat exchanger 20 opposite first surface 22 is disposed in thermal contact with the surface to be cooled.

Fan unit 30 is preferably accommodated in a recess 18 of housing frame 10 in such a way that frame 31 of fan unit 30 is oriented parallel to the direction of external air flow 70. This prevents fan blades 32 from being damaged by external air flow 70 when fan unit 30 is at a standstill.

Control unit 40 is preferably located in a sealed chamber within recess 19 of the housing frame.

FIG. 2 schematically shows first air flow 60, which is generated by fan unit 30 and is oriented toward first surface 22 of heat exchanger 20. In the area of first surface 22, air flow 60 produces turbulences which enhance the heat dissipation. For example, first air flow 60 may escape through air outlet opening 16 of housing frame 10. If there is no external air flow 70, first air flow 60 may also escape through air inlet opening 14 of housing frame 10.

Figure 3:
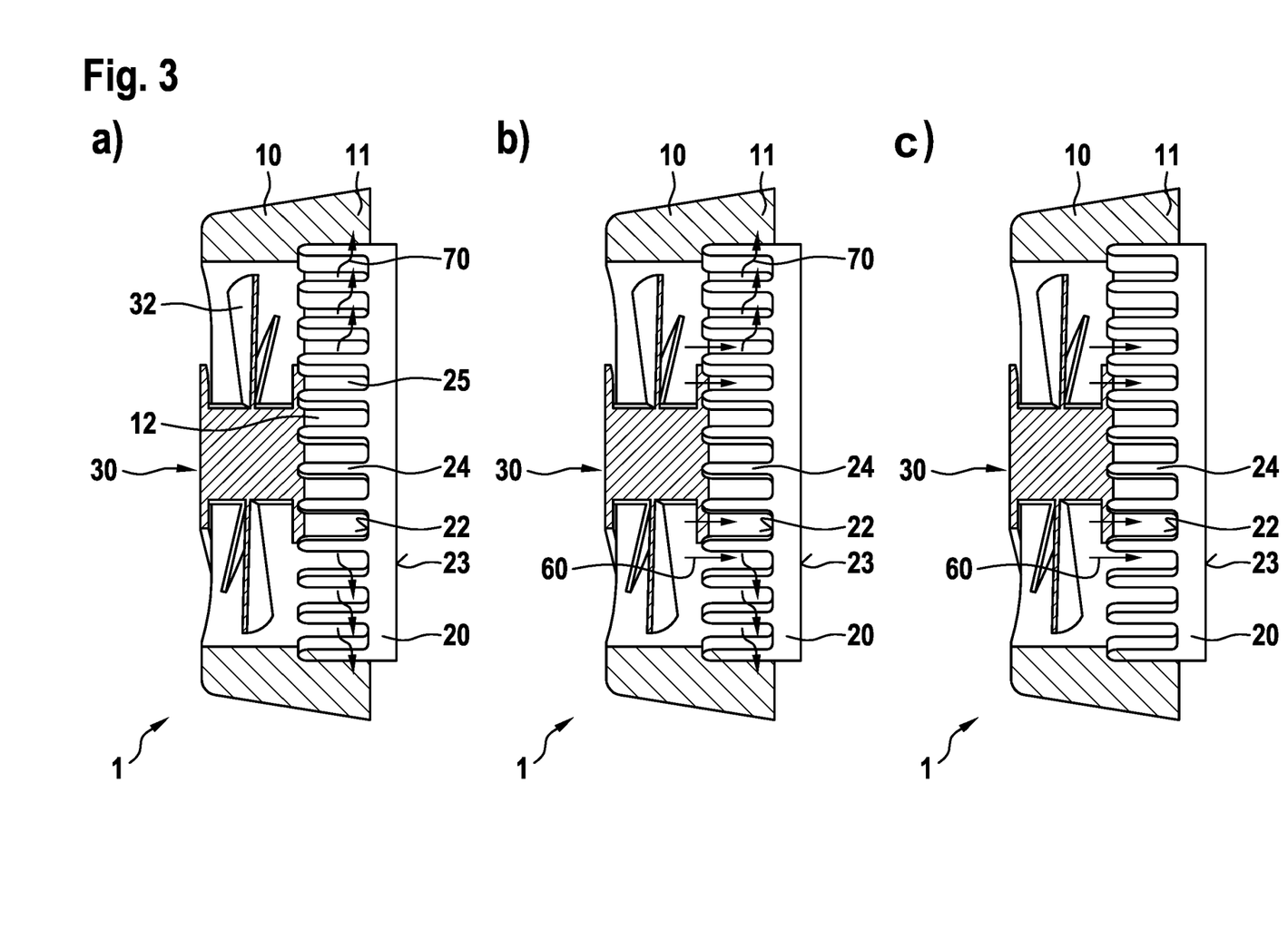

FIG. 3 is a sectional view of cooling device 1 in accordance with the exemplary embodiment of FIGS. 1 and 2, the sectional view in the area of the fan unit being shown along line of intersection 80 from FIG. 2. It becomes apparent here that, in this exemplary embodiment, housing frame 10 is mounted on heat exchanger 20 by housing frame 10 being placed on heat exchanger 20, in particular on cooling fins 24 at the edge of heat exchanger 20. For this purpose, the housing frame has projections 11 on two opposing sides, enabling heat exchanger 20 to be inserted into housing frame 10.

FIG. 3*a*) represents a first operating mode of cooling device 1. In this first operating mode, fan unit 30 is not in operation. A second, external air flow 70, which is generated by a movement, for example, flows through air channel 12, which is formed between housing frame 10 and heat exchanger 20, in particular air flow 70 passes in intermediate spaces 25 between cooling fins 24. In this first operating mode, the cooling power depends on the properties of external air flow 70. This operating state, commonly referred to as a passive operating state, is set when external air flow 70 is sufficient to achieve the desired cooling of the heat exchanger, in particular of first surface 22 and/or of second surface 23.

FIG. 3*b*) represents a second operating mode of cooling device 1. In this second operating mode, fan unit 30 is additionally in operation. Fan unit 30 generates a first air flow 60 which is oriented toward first surface 22 of heat exchanger 20. A second, external air flow 70, which is generated by a movement, for example, additionally flows through air channel 12, which is formed between housing frame 10 and heat exchanger 20. First air flow 60 is directed substantially orthogonally to second air flow 70. In this first operating mode, the cooling power depends on the properties of external air flow 70 and on first air flow 60 generated by fan unit 30. This second operating state is set when external air flow 70 is, in fact, present but, alone, is not sufficient to achieve the desired cooling of the heat exchanger, in particular of first surface 22 and/or of second surface 23. Control unit 40 drives fan unit 30 to this effect, for example, by adapting the rotational speed. The feedback control is performed as a function of a recorded measured quantity, in particular of the temperature of the heat exchanger, in particular of first surface 22 and/or of second surface 23.

FIG. 3*c*) represents a third operating mode of cooling device 1. In this third operating mode, there is no or only a negligible second, external air flow. Fan unit 30 is in operation. Fan unit 30 generates a first air flow 60 which is oriented toward first surface 22 of heat exchanger 20. In this first operating mode, the cooling power depends on the properties of first air flow 60 generated by fan unit 30. This third operating state is set, for example, when there is no or only a negligible external air flow at standstill or in the case of very slow movement. Control unit 40 drives fan unit 30 to this effect, for example, by adapting the rotational speed, the rotational speed in the third operating mode being in particular higher than in the second operating mode. The feedback control is also performed here as a function of a recorded measured quantity, in particular of the temperature of the heat exchanger, in particular of first surface 22 and/or of second surface 23.

Figure 4:
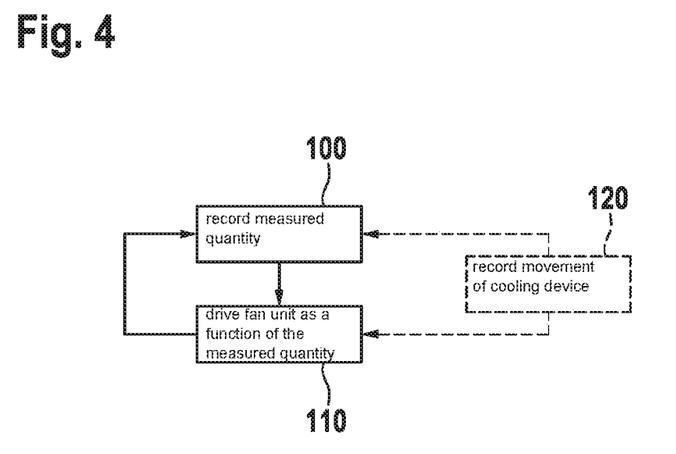
FIG. 4 shows a flow chart of an example method for cooling a heat-radiating apparatus in accordance with one possible embodiment of the present invention.

In a flow chart, FIG. 4 schematically represents a method for cooling a heat-radiating apparatus in accordance with one possible embodiment of the present invention. The heat-radiating apparatus may, in particular be a driving environment sensor of a motor vehicle, especially a lidar sensor. The method employs a cooling device 1, for example, which is designed in accordance with the illustrations of FIG. 1 through 3.

In a first method step 100, sensor device 50 of the at least used cooling device 1 records a measured quantity, in particular a temperature and/or a flow velocity. For example, the surface temperature of heat exchanger 20 is recorded. The temperature may be recorded at first surface 22 and/or at second surface 23 of heat exchanger 20.

In following step 110, fan unit 30 of cooling device 1 is driven as a function of the measured quantity recorded in step 100. If the measurement of the temperature reveals, for example, that the measured quantity, in particular a recorded temperature of heat exchanger 20 exceeds a specific first threshold value, then fan unit 30 may be put into operation, and a first air flow 60 may be generated by fan unit 30. Measured quantity is continuously recorded in accordance with step 100. If, for example, a rising temperature is recorded over a plurality of measurement cycles, then the rotational speed of fan unit 30 may be increased in step 110. If, for example, the temperature recorded in step 100 falls below a second threshold value, then fan unit 30 may be deactivated in step 110. In case 120 of a movement of cooling device 1 in a predefined direction, a second air flow 70 is generated through air channel 12 of cooling device 1.

A movement 120 of cooling device 1 and resultant second air flow 70 influence the measured quantity recorded in step 100 and thus also the driving of fan unit 30 performed in step 110. For example, if there is no movement 120 and, consequently, no second air flow 70, then a temperature of heat exchanger 20 recorded in step 100 may be appreciably higher than when a significant second air flow 70 is present. As a result, it is necessary that fan unit 30 be operated at a higher speed in step 110 than when there is no significant second air flow 70. On the other hand, if a second air flow 70 is present, then, in step 110, the fan unit may not have to be driven at all or only at a low rotational speed.

Figure 5:
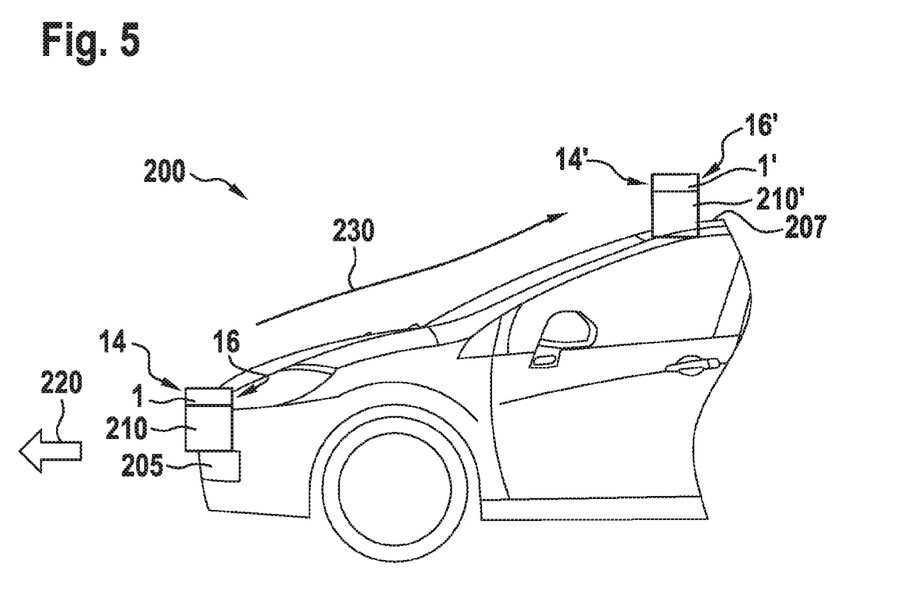
FIG. 5 shows an example vehicle having a driving environment sensor and a cooling device designed in accordance with the present invention.

FIG. 5 shows the front of a vehicle 200, including a heat-radiating apparatus 210, which is mounted on the vehicle and is located in the area of bumper 205 of vehicle 210, in particular above bumper 205, for example, in the middle between the headlights. Apparatus 210 is, in particular a driving environment sensor, for example, a lidar sensor having associated power electronics. Furthermore, vehicle 200 also has a cooling device 1, which is designed in the manner explained in connection with FIG. 1 through 3, for example. A second surface 23 of heat exchanger 20 of cooling device 1 opposite first surface 22 of heat exchanger 20 of cooling device 1 is disposed in heat-conductive contact with heat-radiating apparatus 210, cooling device 1 being oriented in such a way that a forward movement of vehicle 200, indicated by arrow 220, results in an air flow 230 passing through the at least one air channel 12 of cooling device 1, thereby forming an external, second air flow 70. In the illustrated configuration of lidar sensor 210 in the area of bumper 205, the use of a cooling device 1 according to the present invention is particularly advantageous since the lidar sensor is exposed to the waste heat of the engine. Alternatively or additionally, a heat-radiating apparatus 210' having a cooling device 1' according to the present invention, for example, a further or alternatively mounted lidar sensor, may also be located on roof 207 of vehicle 200. Cooling device 1' is likewise oriented in such a way that a forward movement of vehicle 200 passes air flow 230 through the at least one air channel of cooling device 1', thereby forming an external, second air flow 70. Possible are other alternative mounting locations of a heat-radiating apparatus having a cooling device according to the present invention on vehicle 200.

Figure 6:
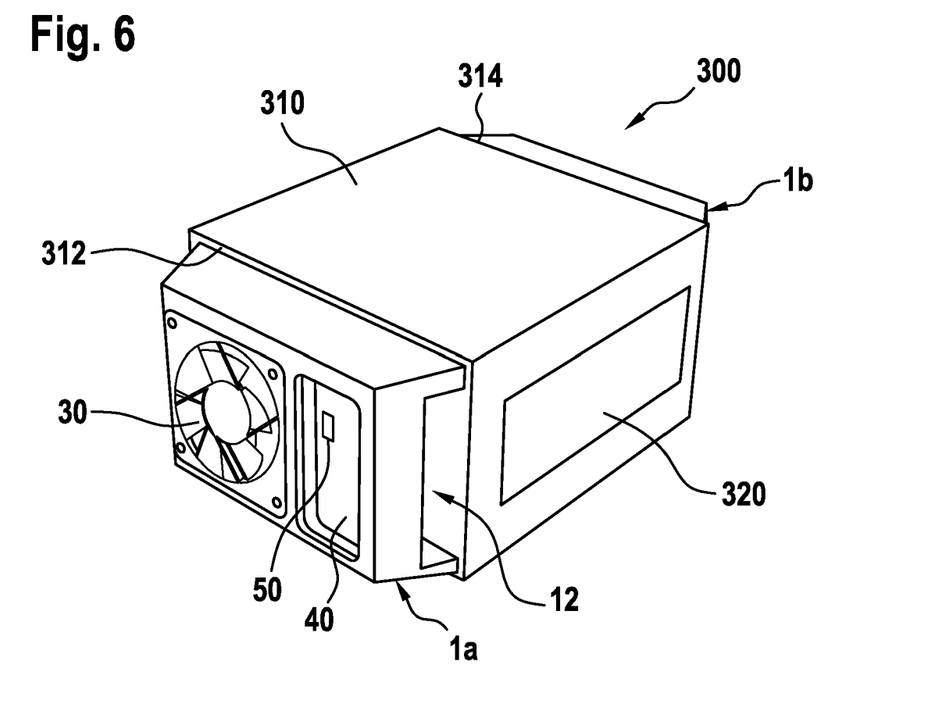
FIG. 6 shows an exemplary embodiment of an inventive lidar sensor in accordance with the present invention.

FIG. 6 shows a lidar sensor 300 in accordance with a possible variant of the present invention. Lidar sensor 300 has a housing 310 within which the sensor electronics and optics are accommodated and has a measurement window 320. Housing 310 is essentially rectangular in form. Two cooling devices 1a and 1b are situated on opposite side surfaces 312 and 314 of housing 310. In this case, side surfaces 312 and 314 form the heat exchangers of cooling devices 1a and 1b. Thus, cooling devices 1a and 1b are integrally formed with housing 310 of lidar sensor 300. Cooling devices 1a and 1b are oriented in such a way that, in the case of a movement of lidar sensor 300 in a predefined direction, an external air flow 70 is generated through each of cooling devices 1a, 1b.

What is claimed is:

1. A cooling device for a driving environment sensor of a motor vehicle, comprising:
    a housing frame;
    a heat exchanger;
    an electrically drivable fan unit;
    a controller; and
    a sensor;
    wherein the fan unit is configured so that, during operation of the fan unit, a first air flow is generated toward a first surface of the heat exchanger,
    wherein the housing frame has at least one air channel having an air inlet opening and an air outlet opening, the air channel being formed parallel to the first surface of the heat exchanger, allowing a second air flow to pass through the air channel along the first surface,
    wherein at least one measured quantity is recorded,
    wherein the controller is configured to drive the fan unit as a function of the at least one recorded measured quantity, and
    wherein the housing frame is arranged on the heat exchanger and partially projects laterally beyond the heat exchanger, and wherein a lateral length of the housing frame is greater than a height or depth of the housing frame.

2. The cooling device as recited in claim 1, wherein the housing frame is detachably mechanically coupled to the heat exchanger.

3. The cooling device as recited in claim 1, wherein the heat exchanger is connected to a heat-radiating apparatus.

4. The cooling device as recited in claim 1, wherein the heat exchanges is connected to a housing of a driving environment sensor.

5. The cooling device as recited in claim 1, wherein the fan unit is accommodated in a recess of the housing frame.

6. The cooling device as recited in claim 1, wherein the first surface of the heat exchanger has a plurality of cooling fins.

7. The cooling device as recited in claim 6, wherein the cooling fins are oriented along the air channel.

8. The cooling device as recited in claim 1, wherein the sensor includes at least one temperature sensor.

9. The cooling device as recited in claim 8, wherein a temperature of the heat exchanger or of a surface to be cooled is recorded as the measured quantity.

10. The cooling device as recited in claim 1, wherein the housing frame has a material having a thermal conductivity of less than 15 W/mK.

11. The cooling device as recited in claim 1, wherein the heat exchanger has a material having a thermal conductivity of more than 50 W/mK.

12. The cooling device as recited in claim 1, wherein:
    the measured quantity includes at least one of a temperature and a flow velocity,
    the cooling device is configured to drive the fan unit, as a function of the recorded measured quantity, to generate the first air flow, and
    the second air flow is generated through the air channel in the case of a movement of the cooling device in a predefined direction.

13. The cooling device as recited in claim 1, wherein the electrically drivable fan unit is accommodated in a recess of a surface of the housing frame, and wherein the controller is accommodated in another recess of the surface of the housing frame.

14. The cooling device as recited in claim 1, wherein the heat exchanger includes a cooling plate having a first surface that faces the housing frame.

15. The cooling device as recited in claim 1, wherein the housing frame includes a material having a particular thermal conductivity, and wherein the heat exchanger includes another material having a higher thermal conductivity.

16. The cooling device as recited in claim 15, wherein the material includes a plastic, and wherein the another material includes a metal, an alloy or a ceramic.

* * * * *